United States Patent [19]
Greene et al.

[11] Patent Number: 5,171,608
[45] Date of Patent: Dec. 15, 1992

[54] METHOD OF PATTERN TRANSFER IN PHOTOLITHOGRAPHY USING LASER INDUCED METALLIZATION

[75] Inventors: Richard F. Greene, Charlotte, N.C.; Joseph Zahavi, Haifa, Iran; Pehr E. Pehrsson, Alexandria, Va.; Christie R. Marrian, Marbury, Md.

[73] Assignee: The Unites States of America as represented by the Secretary of the Navy, Washington, D.C.

[21] Appl. No.: 589,754

[22] Filed: Sep. 28, 1990

[51] Int. Cl.$^5$ .......................... B05D 3/06; B05D 5/12
[52] U.S. Cl. ....................................... 427/555; 427/98; 427/123; 427/125; 427/586; 427/581
[58] Field of Search ............... 427/53.1, 54.1, 96, 427/98, 123, 125

[56] References Cited

U.S. PATENT DOCUMENTS

| | | | |
|---|---|---|---|
| 4,024,029 | 5/1977 | Rain et al. ............................. | 204/29 |
| 4,239,789 | 12/1980 | Blum et al. ........................... | 427/53.1 |
| 4,349,583 | 9/1982 | Kulynych et al. .................. | 427/53.1 |
| 4,766,009 | 8/1988 | Imura et al. ......................... | 427/53.1 |
| 4,822,633 | 4/1989 | Inoue .................................... | 427/53.1 |
| 5,059,449 | 10/1991 | van der Putten et al. ......... | 427/53.1 |
| 5,063,083 | 11/1991 | Fisch et al. .......................... | 427/54.1 |

Primary Examiner—Marianne Padgett
Attorney, Agent, or Firm—Thomas E. McDonnell; Barry A. Edelberg

[57] ABSTRACT

Method for improved photolithography using a laser induced metallization process to produce a metal mask wherein a work piece surface is treated to have a predetermined pattern of at least two materials each having different electron band gaps, the treated work piece is positioned in a metallizing solution, and the workpiece is exposed to a laser beam having a wavelength corresponding to the electron gap of a selected one of the materials. The method can advantageously be used to produce ohmic contacts for microcircuit devices.

20 Claims, 3 Drawing Sheets

METHOD OF PATTERN TRANSFER IN PHOTOLITHOGRAPHY USING LASER INDUCED METALLIZATION

FIELD OF THE INVENTION

The present invention relates generally to photolithography and more specifically a method for laser induced metallization on the substrate of a microcircuit device.

BACKGROUND OF THE INVENTION

The basis of all micro-fabrication techniques is the replication of a pattern in a substrate. In photolithography, a series of contact masks are used to transfer a series of patterns onto the surface of a microcircuit chip. As each pattern is formed on top of the last, individual circuit elements are built up layer by layer.

FIG. 1 is a flowchart of the steps typically employed in photolithography to transfer a pattern to a microcircuit chip or work piece. At step 1, an oxide layer is deposited onto a substrate. During step 2, the substrate, and subsequently deposited patterns, are coated with an energy sensitive layer of material called a photoresist or resist. At step 3, a contact mask is placed on the microcircuit chip or work piece. During step 4, the contact mask and the underlying resist layer are exposed to an energy source such as ultraviolet light, and portions of the resist are hardened or developed. (Both positive and negative resists are known, so either the exposed or unexposed resist advantageously may be hardened.)

During step 5, the unhardened sections of the resist layer are washed away, leaving a resist mask on the surface of the work piece surrounding exposed areas of the oxide layer. Following step 5, oxide layer etching is performed (step 6) to remove portions of the exposed oxide layer from the substrate. The resist mask is stripped from the work piece during step 7. The work piece is now ready for impurity introduction using techniques such as diffusion and ion implantation to form electrically active areas in the substrate. The steps shown in FIG. 1 can be performed several times during the fabrication process.

In order to produce microcircuit devices with smaller and smaller dimensions, e.g., smaller separations between the active areas in the substrate, the thickness of the resist must be reduced correspondingly. This in turn decreases the resist's ability to withstand subsequent oxide etching steps, e.g., removal of the substrate not covered by the resist mask. Oxide etching defects can occur which result in poorly defined oxide layer edges and, consequently, irregularly sized diffusion windows. In addition, the thinness of the resist layer can result in resolution losses during the resist development step.

Several alternative techniques have been developed to produce resist masks with more oxide etching resistance. The most commonly employed method involves a two step resist mask production process. A first, relatively thick resist layer with a thickness of about 1000 nanometers (nm) is deposited on the oxide layer. Over this thick resist layer, a second, relatively thin resist layer having a thickness of about 1 nm is deposited. A pattern is developed in the thin resist layer and then both resist layers are selectively removed by reactive ion etching (RIE). However, RIE is a complex process, requiring significant expenditures for capital equipment and operator training.

Another method for overcoming the difficulties resulting from the fabrication of smaller and smaller devices is the formation of a metal mask to replace the resist masks discussed above. U.S. Pat. No. 4,578,157 discloses a method of laser induced metal deposition onto a layer of gallium arsenide (GaAs) semiconductor substrate. Metal deposition or metallization is controlled by pulsing a laser beam through a metal bearing solution as the substrate is precisely moved by a computer controlled positioning device. This maskless process again requires substantial outlays for capital equipment.

SUMMARY OF THE INVENTION

Accordingly, one object of the present invention is to provide an improved photolithographic method using laser induced metallization on a substrate.

Another object is to provide an improved photolithographic method using laser induced metallization wherein metallization is controlled by the wavelength of the laser beam.

Still another object is to provide an improved photolithographic method using laser induced metallization wherein metallization is controlled by the electron band gap of the substrate.

A further object is to provide an improved photolithographic method using laser induced metallization wherein metallization is preformed at a lower cost.

Another object is to provide an improved photolithographic method using laser induced metallization for producing ohmic contacts on a microcircuit device.

These and other objects and advantages are achieved in accordance with the present invention by the steps of: treating a work piece so as to form on at least one surface a predetermined pattern of at least two materials each having different electron band gaps; positioning the treated work piece in a solution containing a predetermined metal for metallization of the work piece; and exposing the at least one surface of the positioned work piece to a laser beam having a wavelength corresponding to the electron band gap of a selected one of at least two materials to produce metallization on the at least one surface.

BRIEF DESCRIPTION OF THE DRAWINGS

These and other features and advantages of the present invention are disclosed in or apparent from the following detailed description of preferred embodiments. The preferred embodiments are described with reference to the drawings, in which like or similar elements are denoted throughout by like numbers, and in which.

DESCRIPTION OF THE PREFERRED EMBODIMENTS

Figure 1:
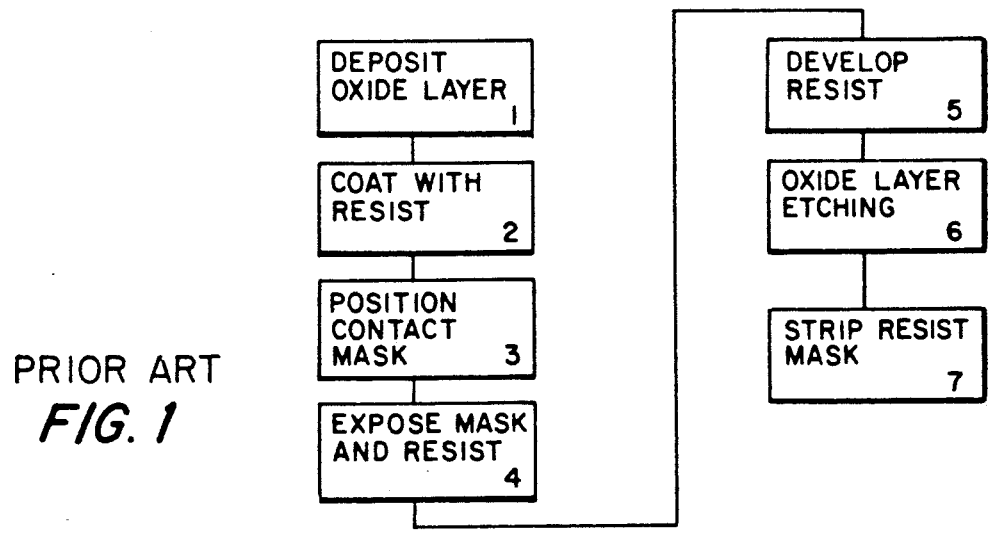
FIG. 1 is a flowchart showing the steps of a prior art photolithography process.
Figure 2:
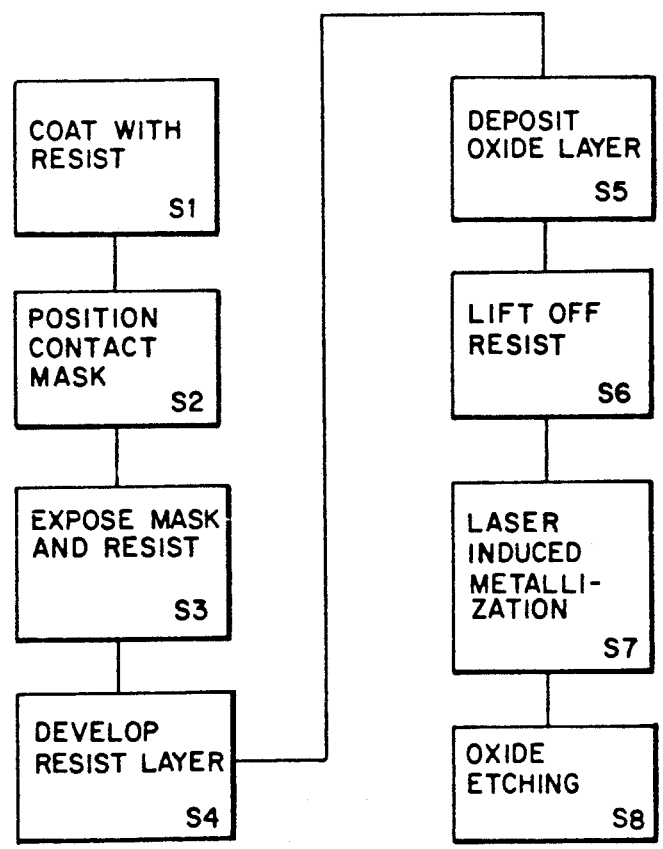
FIG. 2 is a flowchart showing the photolithographic process of the preferred embodiment of the present invention.

Referring to FIG. 2, at the start of the laser induced metallization process of the present invention, a substrate material of a work piece is coated with a resist layer during step S1. During step S2, a contact mask is placed on the resist layer and during step S3, the contact mask and the underlying resist layer are exposed to an energy source such as ultraviolet light and portions of the resist are hardened or developed. Both positive and negative resists are known, so either the exposed or unexposed resist may be advantageously hardened.

During step S4, the unhardened sections of the resist layer are washed away, leaving a resist mask on the surface of the work piece surrounding exposed areas of substrate. Following step S4, an oxide layer is deposited over both the exposed substrate and the resist mask at step S5. The resist mask, and the oxide layer in contact with the resist mask, are removed by conventional lift off techniques during step S6, leaving a secondary pattern of oxide layer on the substrate.

Laser induced metallization is now performed during step S7. The substrate with the secondary pattern of oxide layer is immersed in a solution containing a predetermined masking metal and both the substrate and the oxide layer surfaces are exposed to a laser beam having a predetermined wavelength. Preferably, the solution depth is maintained at about 1.0 millimeters while the solution is circulated to prevent depletion of the masking metal in the solution adjacent to the substrate. A conventional electroplating solution advantageously can be used as the masking metal solution. Laser induced metallization produces a metal mask directly above the exposed substrate but induces no metallization on the surface of the oxide layer. Following step S7, conventional oxide etching is performed during step S8 to remove portions of the exposed oxide layer surrounded by the metal mask formed on the substrate.

The work piece is now ready for impurity introduction using conventional techniques such as diffusion and ion implantation to form electrically active areas in the substrate. According to one aspect of the preferred embodiment of the present invention, the steps shown in FIG. 2 are used to form metal contacts on the surface of the substrate.

The novel features of the present invention will be better understood by referring to the schematic illustrations of FIGS. 3A-3F which show the structures formed on a substrate following the various steps described in reference to FIG. 2.

Figure 3A:
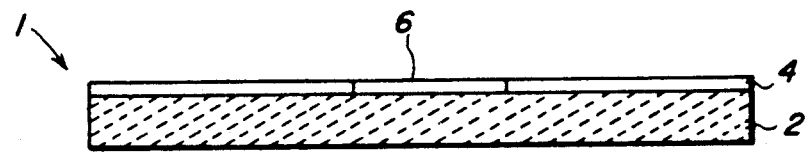
FIGS. 3A, 3B, 3C, 3D, 3E and 3F schematically illustrate the steps of forming a metal mask on a microcircuit substrate in accordance with the present invention.
Figure 3B:
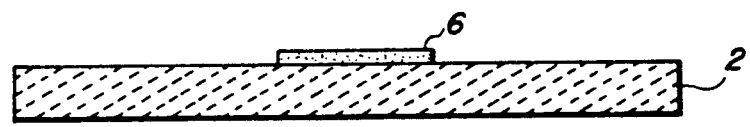

Referring to FIG. 3A, a work piece 1, shown after steps S1 through S3 of FIG. 2 are complete, comprises a substrate 2 of semiconductor material which is coated with a resist layer 4. Preferably, substrate 2 is silicon carbide (SiC), or silicon (Si), although other materials such as gallium arsenide (GaAs) and metallic films advantageously can be used as substrate 2. Most preferably, SiC is used as substrate 2 because of the high bad gap energies, as discussed in detail below. Resist layer 4 has been deposited in any conventional manner on substrate 2 to a thickness of about 20 nm. Resist layer 4 has been irradiated with a predetermined form of electromagnetic energy, e.g., ultraviolet light, to harden a predetermined section 6 of the resist layer 4. Section 6 of resist layer 4 is therefore hardened and is not removed during development step S4 of FIG. 2 to remove unhardened sections of the resist layer 4. FIG. 3B shows the work piece 1 with section 6 remaining on substrate 2 after step S4 of FIG. 2 has been completed.

Figure 3C:
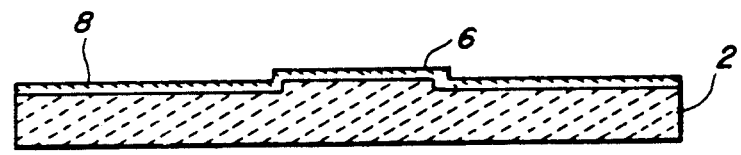
Figure 3D:

In FIG. 3C, an oxide layer 8 is shown deposited on work piece 1, covering both substrate 2 and section 6 to a thickness of about 5 nm. Oxide layer 8 is deposited in any conventional manner during step S5 of FIG. 2. Both section 6 and the material of oxide layer 8 in contact with section 6 are subsequently removed from work piece 1 by conventional lift off techniques during step S6. Work piece 1 is shown following step S6, in FIG. 3D, having a secondary pattern of oxide layer 8 deposited on substrate 2.

Oxide or nitride layer 8 is preferably composed of silicon oxide ($SiO_2$) or silicon nitride ($Si_3N_4$). According to another aspect of the preferred embodiment, either $SiO_2$ and $Si_3N_4$ may be used to form substrate 2 and the other of the two compounds is used to form oxide layer 8. Material selection depends on two factors, the electron band gap of the materials and the wavelength of the laser used in the laser induced metallization process.

Figure 4:
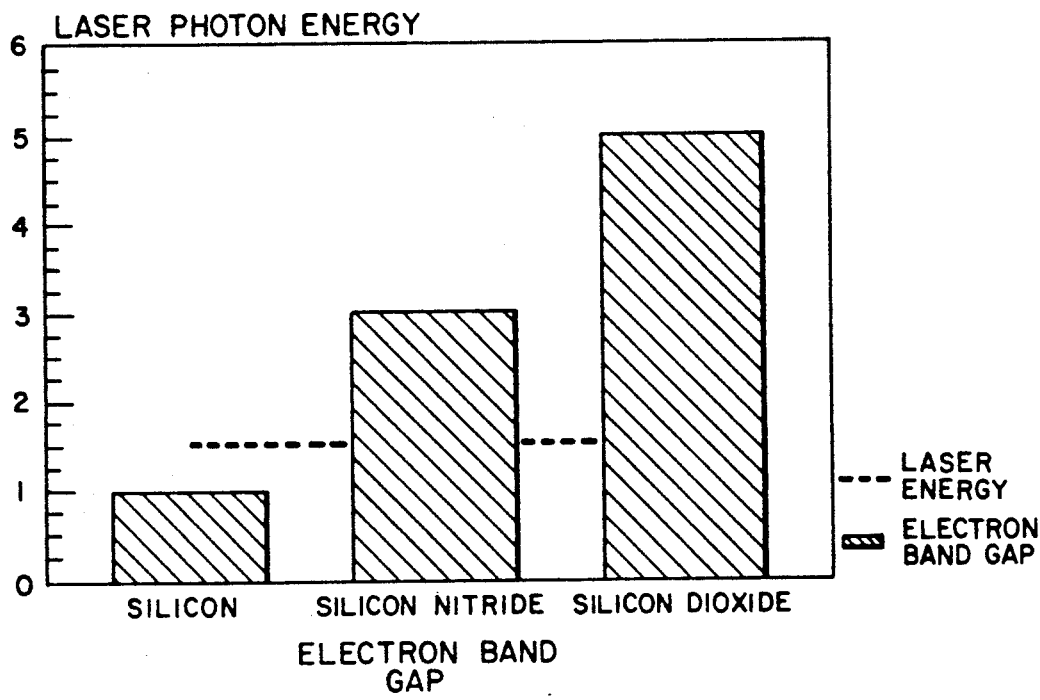
FIG. 4 graphically illustrates the relationship between electron band gaps and energy available from a laser beam.

The laser induced metallization process of the present invention takes advantage of two physical properties. First, laser induced metallization depends on the electron band gap, the energy difference separating the valence band from the conduction band of the same material. That is, for laser induced metallization to occur, the energy supplied by the laser beam must be high enough to move the material's electrons from the valence band to the conduction band. Applicants take advantage of this property by making the substrate and the oxide layer from materials each having a different electron band gap. For example, Si, $SiO_2$ and $Si_3N_4$ all have electron band gaps different from one another. For purposes of illustration, assume that silicon, $S_3N_4$ and $SiO_2$ have electron band gaps of 1, 3 and 5 electron volts, respectively. In the example, if the laser beam supplies 1.5 electron volts of energy to all three materials, laser induced metallization would occur only on the silicon. Laser induced metallization would not occur on either the $SiO_2$ or the $Si_3N_4$ materials because the energy supplied is not sufficient to bridge the electron band gap. The various electron band gap energy levels and the energy available from a laser beam are graphically illustrated in FIG. 4.

In laser induced metallization according to the present invention, the oxide layer 8 acts as a template for the deposition of material on substrate 2. An oxide layer 8 thickness of about 2 to 5 nm is sufficient to produce laser induced metallization on substrate 2 without producing laser induced metallization in extraneous, unwanted areas of the work piece 1.

The other physical property relied upon by the present invention is that the amount of energy supplied by a laser beam to an irradiated material depends on the operating wavelength of the laser employed. That is, as is known in photoexcitation of materials, the amount of energy available from a photon is directly proportional to the frequency of the light source. In addition, the photon energy must match or exceed the energy band gap or the photon will not affect the material at all. Since a laser beam is used as the light source, the frequency of the light source is precisely controllable, so that selective photoexcitation of one material out of a group of closely spaced or adjacent materials is therefore practical.

Figure 3E:
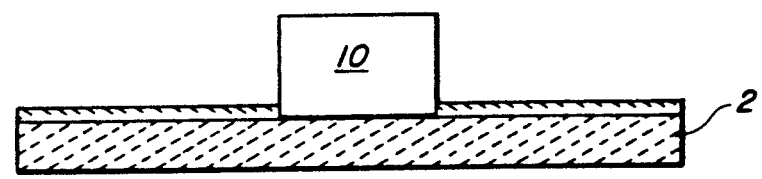

Accordingly, in the laser induced metallization process of the present invention, work piece 1, prepared during steps S1 through S6 of FIG. 2, is then placed at a fixed or stationary location in a solution containing the metal selected for the deposition on the substrate 2. A laser beam with a predetermined wavelength is focused on the surface of work piece 1. The laser beam is then moved in any conventional manner so as to irradiate the entire surface of the work piece 1. Laser induced metallization produces a metal mask 10 (or contact, depending on the end product desired) on those areas of the work piece 1 where the substrate 2 is not covered by oxide layer 8. The metal mask 10 is formed with a thickness of about 200 nm. FIG. 3E shows the work piece 1 after step S7 of the process of FIG. 2 has been completed.

Figure 3F:
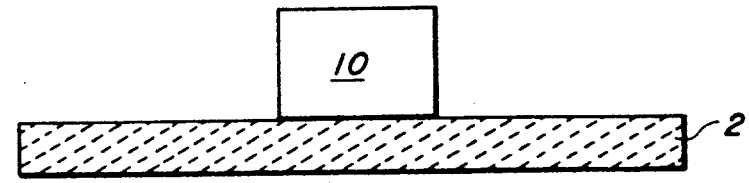

After laser induced metallization has been performed during step S7, work piece 1 is removed from the metal solution and oxide layer 8 can be removed by any conventional oxide etching process during step S8 of FIG. 2. The resulting structure is shown in FIG. 3F.

The method described above advantageously has the ability to produce either metal masks or contacts such as ohmic or Schottky contacts with precise dimensional control. Where silicon based materials are used as the substrate 2, metals such as lead (Pb), platinum (Pt), nickel (Ni), tin (Ti), gold (Au) and aluminum (Al) form silicides which are useful for contacts. Metals such as lead (Pb), platinum (Pt) and aluminum (Al) are also useful for forming the lithographic metal masks.

Experiments were conducted according to the method of the present invention using deep UV laser irradiation, e.g. 248 nanometer (nm) wavelength, of Si and SiC substrate materials. The laser source used supplied 50 milliJoules/pulse. The laser wavelength was selected based on the absorbance of the laser energy through various electroplating solutions, where absorbance $A = -\log T$ and $T = I/I_0$. $I$ is the transmitted light intensity and $I_0$ is the incident light intensity. $I/I_0$ can also be written in the form $I/I_0 = \exp(-\alpha t)$, where $\alpha$ is the absorption coefficient of the electroplating solution and $t$ is the thickness of the solution. Absorbance was characterized for laser wavelengths of 193 nm and 248 nm for commercially available electroplating solutions of gold and palladium/nickel, e.g., 70–75% Pd: 25–30% Ni, both as purchased and after dilution with deionized water using ratios ranging from 1:10 to 1:10,000. The 193 nm laser was rejected as absorbance in the electroplating solutions was unacceptably high at all but 1:10,000 dilution ratios. Absorbance of 248 nm laser light was acceptable using the electroplating solutions at dilutions ratios of 1:10 and 1:50.

Experiments using the 248 nm laser having a pulse duration of 20 nanoseconds were conducted for various substrates and electroplating solutions at a variety of power levels. The principal substrate material of interest was SiC because of the high band gap energies, 2.35 eV and 6.0 eV for the first indirect and direct band gap energies, respectively. The results, indicating laser induced metallization (LIM) lines formed are summarized in the table below:

TABLE

| SUBSTRATE | SOLUTION DILUTION | NUMBER OF PULSES | LASER POWER @ HZ | LIM |
|---|---|---|---|---|
| N-type Si | Au 1:50 | 10–3000 | 0.5 watts @ 10 Hz | Yes |
| N-type Si | Au 1:10 | 2–3000 | 0.5 watts @ 10 Hz | Yes |
| N-type Si | Au none | 500–3000 | 0.5 Watts @ 10 Hz | No |
| N-type Si | Pd/Ni 110 | 600–9000 | — | Yes, Pd lines |
| N-type SiC | Au 1:10 | 50–1000 | 0.5 watts @ 10 Hz | Yes |
| N-type SiC | Au 1:10 | 1200–9000 | 0.5 watts @ 10 Hz | Yes |
| N-type SiC | Au 1:10 | 600–3600 | 0.5 watts @ 10 Hz | Yes |
| N-type SiC | Au 1:10 | 1200–9000 | 2.1 watts @ 30 Hz | Yes |
| N-type SiC | Au 1:10 | 1200–9000 | 1.4 watts @ 30 Hz | Yes |
| N-type SiC with Si₃N₄ masking | Au 1:10 | 1200–9000 | 0.525–0.59 watts @ 10 Hz | Yes |
| N-type SiC with Si₃N₄ masking | Au 1:10 | 1200–9000 | 0.525–0.59 watts @ 10 Hz | Yes |
| Pt foil | Au 1:10 | 1200–9000 | 0.52–0.59 watts @ 10 Hz | Yes |
| Au foil | Au 1:10 | 1200–9000 | 0.52–0.59 watts @ 10 Hz | Darkened lines formed in zone |
| Fused Silica | Au 1:10 | 1350–9000 | 1.5 watts @ 30 Hz | No |
| Fused Silica | Pd/Ni 1:10 | 900–7200 | 1.5 watts @ 30 Hz | No |
| Fused Silica | Au 1:10 | 1350–9000 | 1.5 watts @ 30 Hz | No |
| Fused Silica | Pd/Ni 1:10 | 900–7200 | 1.5 watts @ 30 Hz | No |

Figure 5:
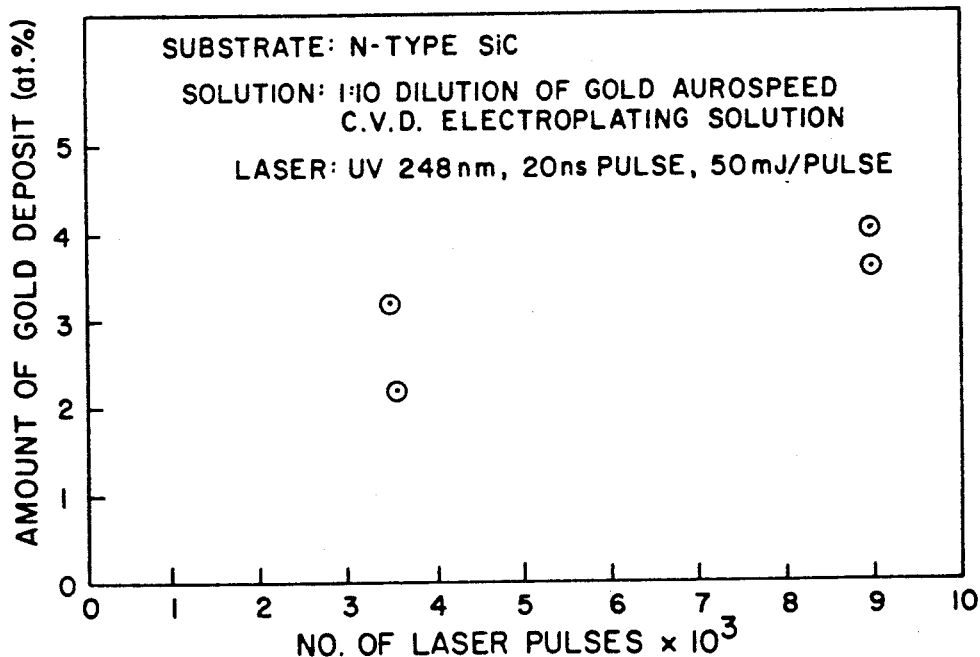
FIG. 5 graphically illustrates the dependance of the amount of metallization on the total exposure to the laser source.

The experiments indicate that the amount of material deposited by laser induced metallization is dependant on the exposure, e.g., the number of laser pulses to which substrate 2 is exposed, as shown in FIG. 5. Increasing the number of laser pulses, for example from 200 to 1000 pulses, produced both wider and thicker gold lines during experiments conducted according to the present invention.

Structures formed during experimentation were also characterized electrically using current-voltage (I-V) curves. I-V curves obtained for gold structures on SiC substrates exhibited curves characteristic of Schottky type contacts.

Those skilled in the art will immediately recognize the advantages of the method of the present invention. Since only those areas of work piece 1 where substrate 2 is exposed will experience laser induced metallization, the process is self aligning. Neither precise placement of photographic masks nor precise control of work piece 1 position during metallization is required. In addition, expensive equipment is not required to build a metal mask 10 using the method of the present invention.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method for forming a metal mask on a work piece comprising the steps of:

treating the work piece so as to provide on at least one surface a predetermined pattern of at least two materials each of which has a valence band and a conduction and, each of said two materials also has a different band gap between said valence and conduction band;

positioning said treated work piece in a solution containing a predetermined metal for metallization of said work piece; and exposing said at least one surface of said positioned work piece to a laser beam having a wavelength matching or exceeding said band gap of a selected one of said at least two materials to thereby selectively produce metallization on said selected one of said at least two materials by selectively exciting an electron in said valance band of said selected material to said conduction band.

2. The method of claim 1, wherein said predetermined metal is at least one of lead, tin, aluminum, platinum, nickel and gold.

3. The method of claim 1, wherein said treating step comprises:

depositing a resist layer over part of said surface of said work piece, a remaining part of said surface remaining uncovered depositing an oxide or nitride layer over both said resist layer and said uncovered part of said surface of said work piece;

removing said resist layer and any part of said oxide or nitride layer onto which said resist layer was deposited, thereby providing said pattern, said pattern including a remaining oxide or nitride layer and a newly uncovered part of said surface of said workpiece which lacks said oxide or nitride layer thereover, each of which corresponds to one of the at least two materials.

4. The method of claim 3, wherein said wavelength of said laser beam corresponds to said band gap of said surface of the workpiece.

5. The method of claim 3, wherein said oxide or nitride layer is at least one of silicon oxide and silicon nitride.

6. The method of claim 1, wherein said positioning step further comprises positioning said work piece at a fixed, stationary location.

7. The method of claim 1, wherein said exposing step comprises irradiating the entire said at least one surface of said work piece.

8. The method of claim 1, wherein said laser is a pulsed laser.

9. The method of claim 5, wherein said oxide or nitride layer is silicon oxide.

10. The method of claim 5, wherein said oxide or nitride layer is silicon nitride.

11. The method of claim 8, wherein said predetermined metal is at least one of lead, tin, aluminum, platinum, nickel and gold.

12. The method of claim 8, wherein said treating step comprises:

depositing a resist layer over part of said surface of said work piece, a remaining part of said surface remaining uncovered depositing an oxide or nitride layer over both said resist layer and said uncovered part of said surface of said work piece;

removing said resist layer and any part of said oxide or nitride layer onto which said resist layer was deposited, thereby providing said pattern, said pattern including a remaining oxide or nitride layer and a newly uncovered part of said surface of said work piece which lacks said oxide or nitride layer thereover, each of which corresponds to one of the at least two materials.

13. The method of claim 12, wherein said wavelength of said laser beam corresponds to said band gap of said surface of the work piece.

14. The method of claim 12, wherein said oxide or nitride layer is at least one of silicon oxide and silicon nitride.

15. The method of claim 8, wherein said positioning step further comprises positioning said work piece at a fixed, stationary location.

16. The method of claim 8, wherein said exposing step comprises irradiating the entire said at least one surface of said work piece.

17. The method of claim 1, wherein the wavelength of said laser beam is in the deep u.v. region.

18. The method of claim 17, wherein said treating step comprises:

depositing a resist layer over part of said surface of said work piece, a remaining part of said surface remaining uncovered depositing an oxide or nitride layer over both said resist layer and said uncovered part of said surface of said work piece;

removing said resist layer and any part of said oxide or nitride layer onto which said resist layer was deposited, thereby providing said pattern, said pattern including a remaining oxide or nitride layer and a newly uncovered part of said surface of said workpiece which lacks said oxide or nitride layer thereover, each of which corresponds to one of the at least two materials.

19. The method of claim 18, wherein said wavelength of said laser beam corresponds to said band gap of said surface of the workpiece.

20. The method of claim 17, wherein said laser is a pulsed laser.

* * * * *

UNITED STATES PATENT AND TRADEMARK OFFICE
CERTIFICATE OF CORRECTION

PATENT NO. : 5,171,608

DATED : December 15, 1992

INVENTOR(S) : Richard F. Greene, et al

It is certified that error appears in the above-identified patent and that said Letters Patent is hereby corrected as shown below:

Title page, Item 75, line 2 change "Haifa, Iran" to -- Haifa, Israel --.

Signed and Sealed this

Twenty-sixth Day of October, 1993

Attest:

BRUCE LEHMAN

Attesting Officer

Commissioner of Patents and Trademarks